(12) United States Patent
Redon et al.

(10) Patent No.: US 6,603,677 B2
(45) Date of Patent: Aug. 5, 2003

(54) THREE-LAYERED STACKED MAGNETIC SPIN POLARIZATION DEVICE WITH MEMORY

(75) Inventors: Olivier Redon, Seyssinet (FR); Bernard Dieny, Lans-en-Vercors (FR); Bernard Rodmacq, Veurey-Voroize (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/988,561

(22) Filed: Nov. 20, 2001

(65) Prior Publication Data

US 2002/0105827 A1 Aug. 8, 2002

(30) Foreign Application Priority Data

Dec. 7, 2000 (FR) .............................. 00 15895

(51) Int. Cl.[7] .......................... G11C 11/00; H01C 7/10; G11B 5/33
(52) U.S. Cl. ................ 365/158; 365/171; 365/173; 338/22; 360/324.1; 324/252; 428/212
(58) Field of Search ................ 365/158, 171, 365/173; 338/22; 360/324.1; 324/252; 428/212

(56) References Cited

U.S. PATENT DOCUMENTS 5,541,868 A    7/1996   Prinz ........................... 365/98
5,640,343 A *  6/1997   Gallagher et al. ........... 365/171
5,661,062 A    8/1997   Prinz .............................. 438/3
5,686,838 A * 11/1997   van den Berg ............. 324/252
5,695,864 A * 12/1997   Slonczewski ................ 428/212
5,959,880 A *  9/1999   Shi et al. ..................... 365/158
6,462,641 B1 * 10/2002   Dieny et al. .............. 338/32 R
6,473,336 B1 * 10/2002   Nakajima et al. ........... 365/171

* cited by examiner

Primary Examiner—Richard Elms
Assistant Examiner—Nam Nguyen
(74) Attorney, Agent, or Firm—Oblon, Spivak, McClelland, Maier & Neustadt, P.C.

(57) ABSTRACT

A magnetic device including at least a memory cell having a first magnetic layer with a fixed magnetization direction. The first magnetic layer spin polarizes a writing current of electrons. The memory cell includes a second magnetic layer having a three-layered stack with a variable magnetization direction. An insulating or semi-conduction layer is formed between the first and second magnetic layers. The variable magnetization direction is oriented by spins of a spin polarized writing current. The three-layered stack includes two magnetic layers separated by a non-magnetic conducting layer. The first magnetic layer aligns the variable magnetization direction with the fixed magnetization direction by directing an incident writing current of electrons perpendicular through the first magnetic layer and then perpendicular through the second magnetic layer. The first magnetic layer opposes the variable magnetization direction with the fixed magnetization direction by directing another incident writing current of electrons perpendicular through the second magnetic layer and then perpendicular through the first magnetic layer to.

11 Claims, 5 Drawing Sheets

THREE-LAYERED STACKED MAGNETIC SPIN POLARIZATION DEVICE WITH MEMORY

TECHNICAL DOMAIN

This invention concerns a magnetic spin polarisation device with a three-layered stack and memory using such a device.

It has applications in electronics and in particular and in particular for the manufacture of memory cells and MRAM (Magnetic Random Access Memory) type memories or direct access magnetic memories.

PREVIOUS STATE OF THE TECHNOLOGY

MRAM magnetic memories have enjoyed an increase in popularity with the development of magnetic tunnel junctions (MTJ) which exhibit high magneto-resistance at ambient temperatures. FIGS. 1A and 1B in the appendix show a schematic representation of the structure and function of such a junction.

The junction is indicated by item 2. It includes a stack having a layer of oxide sandwiched between two magnetic layers. The system operates like a spin valve, apart from the fact that the current flows perpendicular to the plane of the layers. One of the magnetic layers is described as "free" because its magnetisation may be oriented by an external magnetic field (bi-directional arrow); the other is described as "anchored" because its magnetisation direction is anchored by an anti-ferromagnetic exchange layer (unidirectional arrow). When the magnetisation of the magnetic layers is anti-parallel, the resistance of the junction is high; when the magnetisation is parallel, the resistance is low. The relative variation of the resistance between these two states may be up to 40% by appropriate choice of materials.

Junction (2) is located between a switching transistor (4) and a current supply line (6). The current passing through the latter generates a magnetic field (7). A conductor (8), orthogonal to the current supply line (6) (i.e. in this case perpendicular to the plane of the figure) generates a second magnetic field (9) (located in the plane of the figure).

In "write" mode (FIG. 1A), transistor (4) is blocked. Currents flow through the current supply line (6) and the conductor (8). Junction (2) is therefore subjected to two orthogonal magnetic fields. One is applied along the difficult magnetisation axis in the free layer, in order to reduce its reversal field, the other being applied along the easy magnetisation axis in order to generate a reversal of the magnetisation and write in the memory cells. In principle, only the memory cell located at the intersection of lines (6) and (8) is subject to reversal, since each magnetic field taken individually is insufficient to cause reversal of the magnetisation.

In "read" mode (FIG. 1B), the transistor is held in the saturated condition (i.e. the current flowing through it is at a maximum) by a positive current pulse in its base. The current flowing through line (6) only passes through the memory cell whose transistor is open. This current enables the resistance of the junction to be measured. By comparison with a reference memory cell, the state of the memory cell ("0" or "1") may thus be determined.

Such a writing mechanism presents disadvantages particularly within a network of junctions.

1) As the reversal of the free layer magnetisation occurs under the effect of external fields, and since the reversal fields are statistically distributed, it is not impossible to accidentally reverse certain adjacent junctions simply by the effect of the magnetic field produced along the addressing line 6. As, for high density memories, the size of the memory cells is clearly sub-micronic, the number of addressing errors increases.

2) The reduction in size of memory cells results in an increase in the value of the individual reversal field; a larger current is therefore necessary to write in the memory cells, which tends to increase the electrical power consumption.

3) As writing necessitates two current lines at 90°, the constructional density is consequently limited by the presence of these lines.

4) The writing mode employed only enables writing into one memory cell at a time, if one wishes to minimise the danger of addressing errors.

Recently, other types of magnetic device have appeared, where the magnetic reversal is generated not by external magnetic fields but by electrons passing through the stack perpendicular to the plane of the layers. These devices are described in document U.S. Pat. No. 5,695,864. The mechanism employed is based on the transfer of magnetic moments between the electrons on the one hand, and the free layer magnetisation on the other hand. In such a system, the stack is formed of layers which are all electrically conducting, in order to limit the power dissipation. This results in several disadvantages a) The resistance of the device is so low that a very high current must be injected in order to generate a voltage at the terminals comparable to that in conventional systems.

b) Such a current demands the use of a large size transistor, which limits the constructional density of the memory.

c) The amplitude of the variation in resistance obtained is very low (2–3%), which limits the output voltage.

d) For MRAM applications, the document referenced mentions three conductor levels and two voltage sources. A central conductor is intended to collect the polarised current used for reversal of the free layer. The device is therefore complex.

The present invention is therefore aimed at overcoming these disadvantages.

PRESENTATION OF THE INVENTION

The invention aims to reduce the critical current density from which magnetisation reversal occurs in the free layer. The work and thinking of the Applicant have identified that this critical density is associated with the specific demagnetising field of the free layer. The invention therefore proposes a device in which this demagnetising field is very low or even zero. To achieve this, a three-layer stack is used (which will be referred to from now on as the "tri-layer stack" or simply "tri-layer") formed of two magnetic layers separated by a non-magnetic conducting layer, the latter being thin enough for the coupling between the two magnetic layers to be strong enough for the magnetisation in these layers to be anti-parallel. Overall, such a system does not exhibit any (or only a slight) demagnetising field. The Applicant refers to such stacks as "synthetic".

More precisely, the invention therefore concerns a magnetic device including:

a first magnetic layer known as the "anchored" layer, which exhibits a fixed magnetisation direction, a second magnetic layer known as the "free" layer, which exhibits a variable magnetisation direction, an insulating or semi-conducting layer which separates the anchored and free layers, means for passing a current of electrons through and perpendicular to the layers, means for polarising the spin of those electrons, characterized in that the free magnetic layer, at least, includes a first tri-layer stack having two anti-parallel magnetisation layers separated by a conducting non-magnetic layer.

In one design, the trapped layer itself consists of a tri-layer stack, this second stack being covered by an anti-ferromagnetic exchange layer which fixes the direction of magnetisation in the said second tri-layer stack.

In another design, the device includes a third tri-layer stack separated from the first by a conducting non-magnetic layer, this third tri-layer stack being mounted on a second anti-ferromagnetic exchange layer which fixes the magnetizations in this third tri-layer.

The material used for the magnetic layers in the first and/or second and/or third tri-layer stacks should preferably be chosen from the group consisting of Co, Fe, Ni and their alloys.

The non-magnetic conducting layer in the first and/or second and/or third tri-layer stacks should preferably be a metal chosen from the group consisting of Ru, Re, Cu, Cr, Pt, Ag.

The first and/or second anti-ferromagnetic layer may be a Mn-based alloy (e.g. FeMn, IrMn, PtMn, PtPdMn, RuRhMn).

BRIEF DESCRIPTION OF THE DIAGRAMS

FIGS. 1A and 1B, already described, show a known device for writing and reading binary data in a tunnel effect magnetic junction using external magnetic fields;

DESCRIPTION OF THE PARTICULAR DESIGNS

Regarding the spin polarisation phenomenon for electrons circulating in tunnel junction devices, it is useful to recall the following principles. An electric current flowing through a conductor consists of electrons whose spin has no particular reason to be oriented in any specific direction. When this current passes through a magnetic layer having a particular magnetisation, the spins will be oriented by magnetic moment exchange phenomena, such that the electrons leave the layer with a polarised spin. Such a layer (or set of layers) thus constitutes a "polariser". This phenomenon is applicable both to transmission (through a layer) and to reflection (from a layer), according to the direction of the current flow. It may also act in the reverse direction by preferentially allowing electrons to pass which have a polarised spin in a certain direction. The function of the layer in such case is to act as an analyser.

Referring now to the first design of the invention, this consists in using a tunnel function formed by stacking two tri-layers on either side of an insulating layer, for example made of alumina ($Al_2O_3$). One of the tri-layers has its direction anchored by exchange coupling with an anti-ferromagnetic layer. This layer fulfils the double role of polariser (in writing) and analyser (in writing and reading). The choice of a tri-layer was adopted to eliminate the magneto-static coupling with the second tri-layer and therefore to enable the memory to be used without any external compensation field. The other tri-layer is free to orient itself in the direction of the spin polarisation. This layer exhibits a planar anisotropy which defines an easy and a difficult magnetisation axis in order to reduce the writing time. The thickness of the magnetic layers in this tri-layer system is approximately equal in order to eliminate the effect of the demagnetising field and therefore to allow the magnetisation of this layer to precess easily out of the plane.

In writing mode, a current passing through the junction, with a density greater than the critical density, generates a precession and alignment of the magnetisation in the free layer (the closest to the oxide layer) by transfer of the magnetic moments of the polarised electrons to the magnetic moments of the free layer. The voltage appearing at the junction terminals, may be used to monitor the magnetic state of the free layer. Writing may be achieved in direct current or in pulsed current, the pulse duration being adjusted according to the magnetisation reversal process.

In reading mode, a current of lower density than the critical density, flows through the junction, enabling the magnetic state of the device to be read, the latter thus behaving as a memory cell.

Figure 1A:
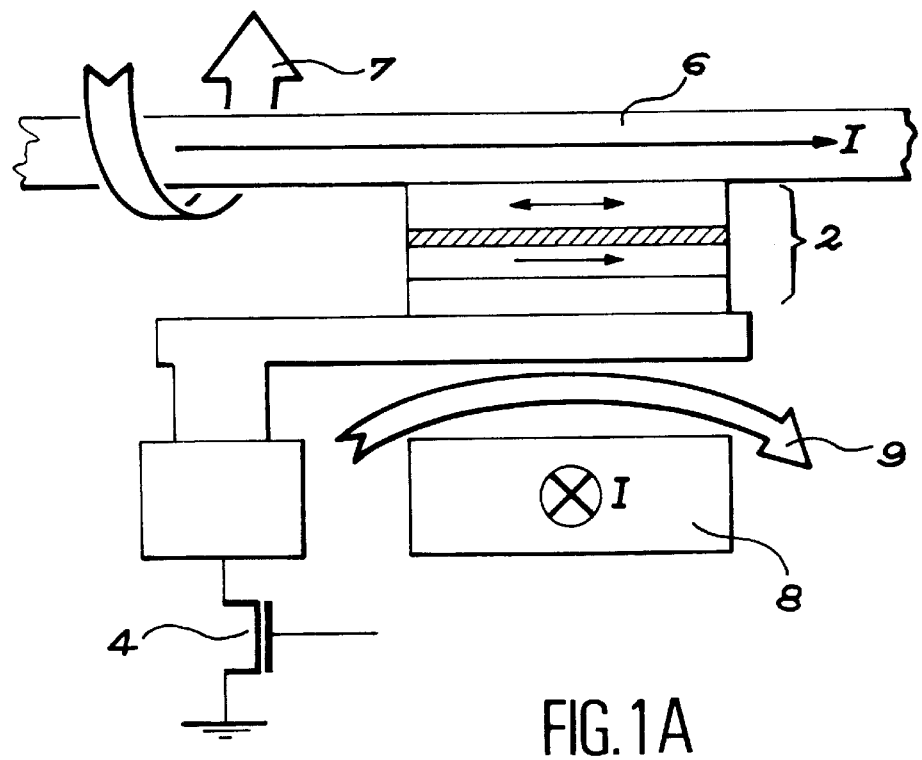
Figure 1B:
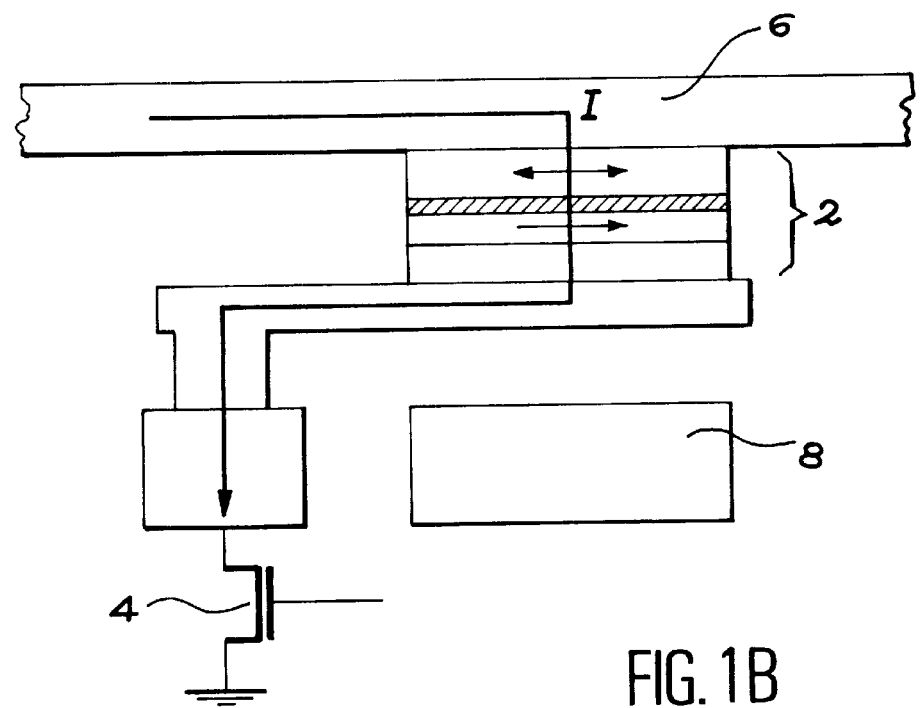
Figure 2:
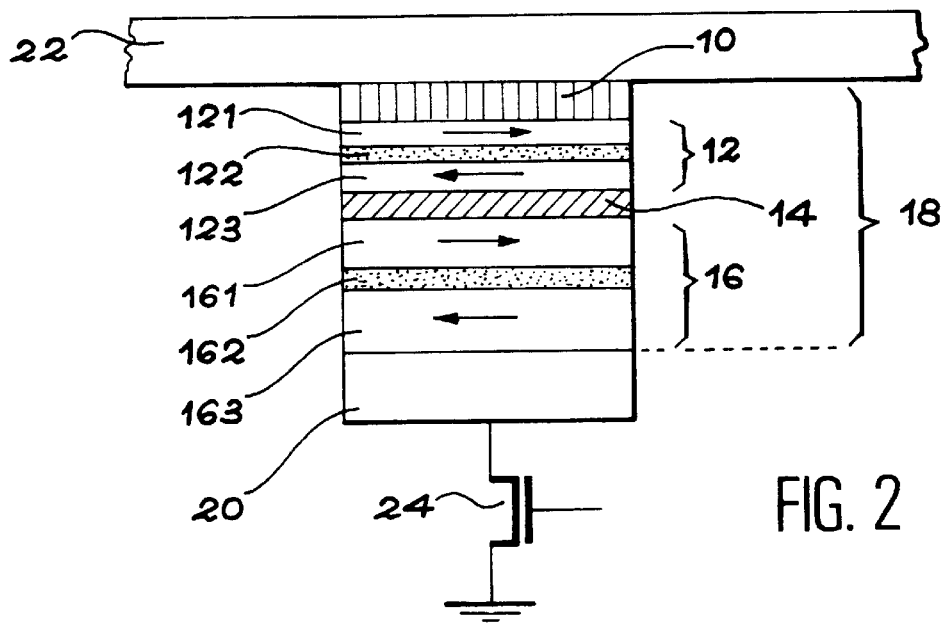
FIG. 2 shows, in section, a first design for a device in accordance with the invention.

FIG. 2 illustrates this first design. As represented, the device includes two tri-layer (or "synthetic") stacks, respectively (12) and (16), one for the anchored layer (12) and the other for the free layer (16). In the variant illustrated, the device successively has from top to bottom, an anti-ferromagnetic exchange layer (10), the anchored layer (12), an insulating non-magnetic layer (14), the free layer (16), the assembly item (18) forming a magnetic tunnel junction. This junction is mounted on a conducting base (20) and is located between a conductor (22) and a transistor (24).

According to the design illustrated, the anchored layer (12) is a tri-layer consisting of two magnetic layers (121) and (123), separated by a non-magnetic conducting layer (122). Similarly, the free layer (16) is a tri-layer consisting of two magnetic layers (161) and (163), separated by a magnetic non-conducting layer (162).

In both tri-layers (12) and (16), the magnetisation of the two magnetic layers is anti-parallel, as shown symbolically in the figure by the arrows in alternate directions, which represent the magnetisation. This anti-parallelism is due to the very strong anti-ferromagnetic coupling which exists between the magnetic layers. The thickness of the magnetic layers (121), (123) should preferably be the same in order to achieve zero magneto-static coupling for the free layer (16).

The free layer (16) has similar characteristics to the anchored layer (12). However, as its exchanges are not anchored, it is free and the direction of its magnetisation changes when a spin polarised current passes through it. This change is associated with the transfer of magnetic moments of the electrons to the magnetisation of the layer. The barrier (14) is preferably formed of a layer of aluminium oxide or nitride, and it is obtained by the widely-known methods (plasma oxidation, natural oxidation in-situ, atomic oxygen source, etc.). Semi-conductor materials may also be used, but their magneto-resistive properties are not as good as those of nitrides and oxides.

Figures 3A, 3B:
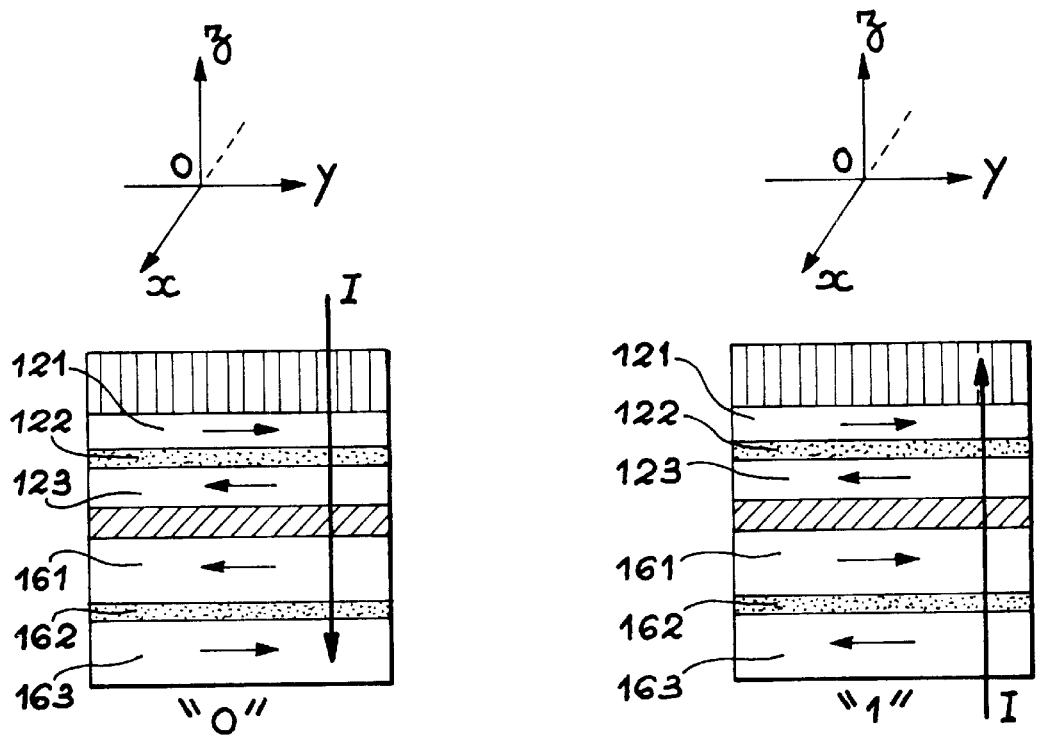
FIGS. 3A and 3B show the orientations of the magnetisation in the different layers according to whether a "0" or a "1" has been written, for this first design.
Figure 4A:
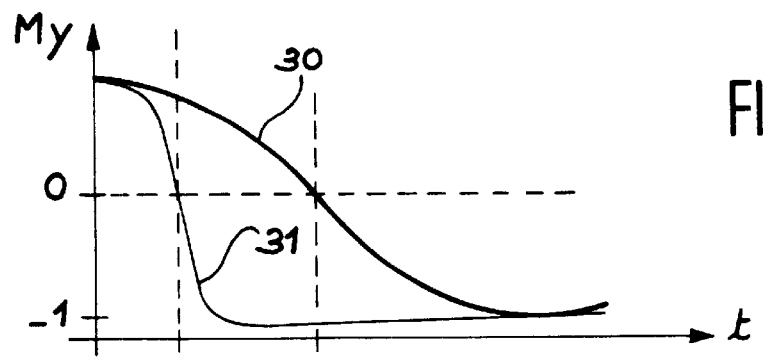
FIGS. 4A and 4B show the transient variations of the magnetisation component in relation to axis Oz perpendicular to the plane of the layers and in relation to axis Oy, parallel to the plane of the layers, in the case of weak and strong anisotropy.
Figure 4B:
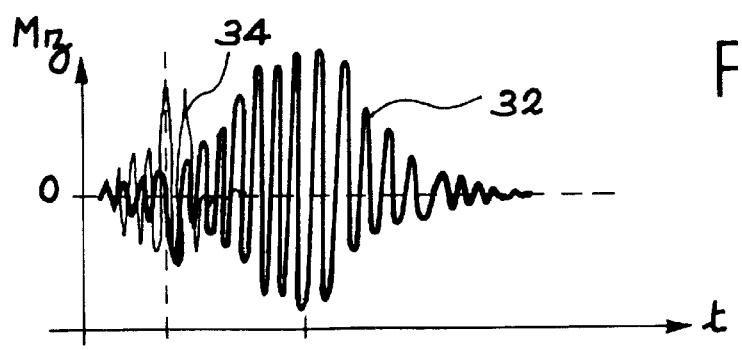

FIG. 3A illustrates the writing of a "0" and FIG. 3B shows the writing of a "1". In these figures, neither the current supply nor the transistor are shown. The different directions are identified in relation to the tri-rectangular trihedron Oxyz, direction Oz being perpendicular to the plane of the layers. Additionally, FIG. 4A shows how the magnetisation component My of layer (161) changes sign and FIG. 4B shows the oscillation of the Mz component during the precession motion associated with the magnetisation reversal.

In order to write a "0", a positive sign current (direct or pulsed) is passed through the stack, i.e. flowing from top to bottom (therefore towards the transistor). The spin of the electrons is polarised in layer (123) in direction (−y). They transmit their magnetic moments to the moments in layer (161), whose magnetisation aligns itself parallel to the magnetisation in layer (123). Layer (163), coupled anti-parallel to layer (161), will therefore also realign itself. During the transfer of magnetic moments, the magnetisation of layer (161) will precess around the axis (−y) with an Mz component oscillating with respect to time, as shown in FIG. 4B. If the angle of the precession cone exceeds 90°, the direction of rotation reverses and the magnetisation is realigned along (+y). The number of precessions required for reversal is dependent on the anisotropy of the layer in its plane. If the anisotropy is weak (graphs 30 and 32), reversal requires a large number of precession oscillations but a low critical current. With stronger anisotropy (graphs 31 and 34) the reversal time is shorter, but a larger current is required in order to overcome the anisotropy.

As already stated, writing can be achieved using direct or pulsed current. In the case of pulsed current, the duration of the pulse must be long enough for the reversal to be complete. Monitoring of the reversal may be achieved by measuring the voltage at the junction terminals. When the magnetizations in layers (123) and (161) are parallel, the probability of transfer of electrons by tunnel effect is high and the resistance of the junction is low. If reversal is not complete, the resistance is high. The magnetic state of the device can be determined by comparison with the voltage measured at the terminals of the reference junction. During the monitoring stage of the magnetic state, layer (123) (fixed by exchange) acts as the analyser to monitor the orientation of the free layer (161).

To write a "1", a negative sign current is passed, as shown in FIG. 3B. Starting from state "0", the electrons in layer (161), mainly polarised according to (−y) pass through layer (123), whereas the minority of electrons polarised according to (+y) accumulate in front of layer (123). These electrons whose spins are anti-parallel to layer (161) transfer their magnetic moments to the moments in layer (41) and generate a precession until reversal of the magnetisation of layer (161) as shown in FIG. 3B. This magnetic configuration corresponds to writing a "1", and the resistance of the junction is at a maximum.

For reading, a current is passed whose density is lower than the critical density and the output voltage is compared with the voltage at a reference junction, in order to determine the magnetic state of the device.

In a second design, the device includes three tri-layers, two of the tri-layers being located on either side of an insulating layer, for example of alumina ($Al_2O_3$). One of these tri-layers has its magnetisation directions anchored by exchange coupling with an anti-ferromagnetic layer. This layer fulfils the double role of polariser (in writing) and analyser (in writing and reading). The purpose of a tri-layer is to eliminate the magneto-static coupling on the second tri-layer and therefore to enable the memory to be used without any external compensation field. The other tri-layer is free to orient itself in the direction of the spin polarisation. This layer exhibits a planar anisotropy which defines an easy and a difficult magnetisation axis in order to reduce the writing time. The thickness of the magnetic layers in this tri-layer system is approximately equal in order to eliminate the effect of the demagnetising field. The device also includes a separate polariser of the tunnel junction by a conducting non-magnetic layer formed preferably by a tri-layer stack anchored by exchange with an anti-ferromagnetic layer in order to maintain its magnetisation direction.

Figure 5:
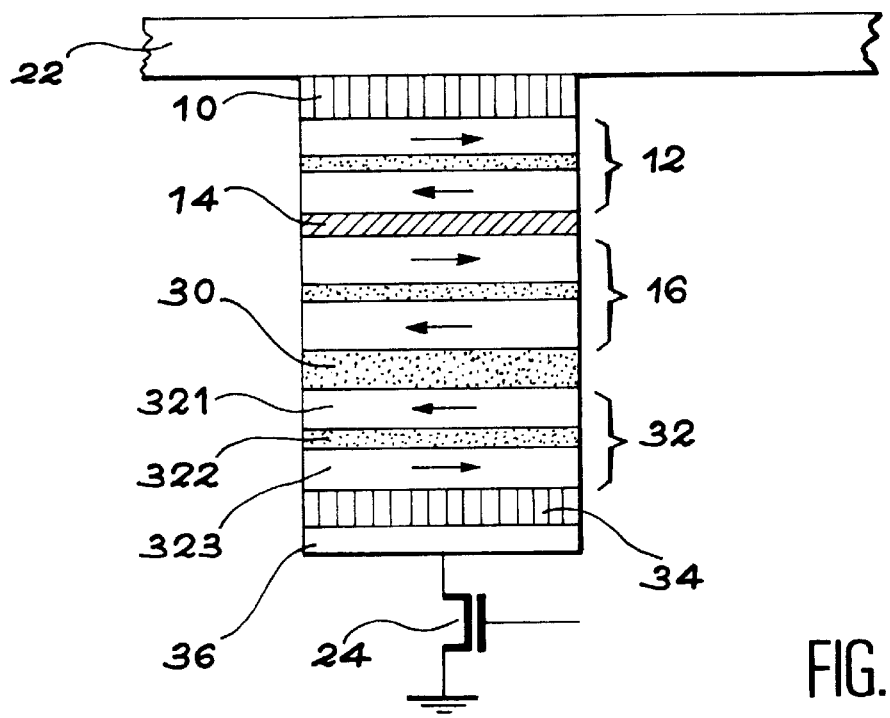
FIG. 5 shows, in section, a second design for a device in accordance with the invention.

FIG. 5 illustrates this second design. The three tri-layers are respectively identified as (16), (12) and (32). The third tri-layer, (32), is separated from the first, (16), by a conducting non-magnetic layer (30). This third tri-layer includes two magnetic layers (321), (323), separated by a conducting non-magnetic layer (322). It is mounted on an anti-ferromagnetic coupling layer (34) which anchors the magnetisation in layer (323), and therefore in layer (321). The third tri-layer (32) is therefore anchored, like the second (12). The assembly is mounted on a conducting base (36).

Layer (30) which separates the first and third tri-layers may consist of a noble metal. Its thickness is chosen between 3 and 10 nm to avoid unwanted magnetic coupling between tri-layers (16) and (32).

Figure 6A:
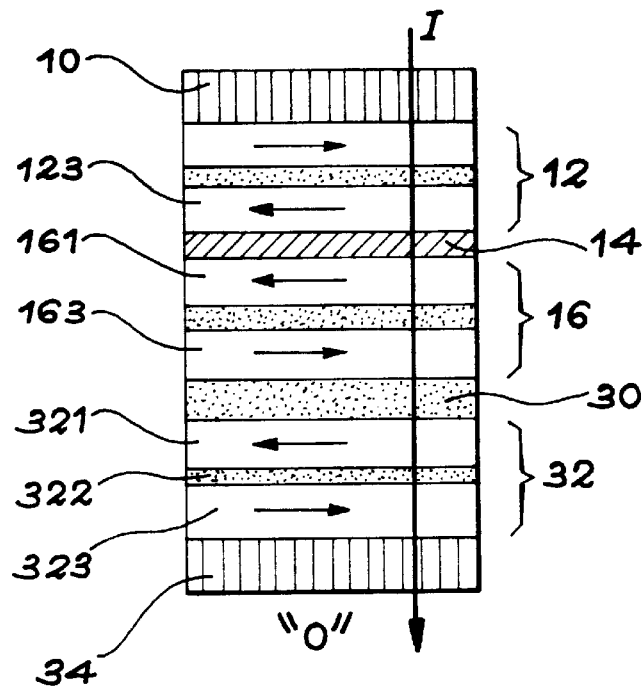
FIGS. 6A and 6B show the orientations of the magnetisation in the different layers according to whether a "0" or a "1" has been written, for this second design.
Figure 6B:
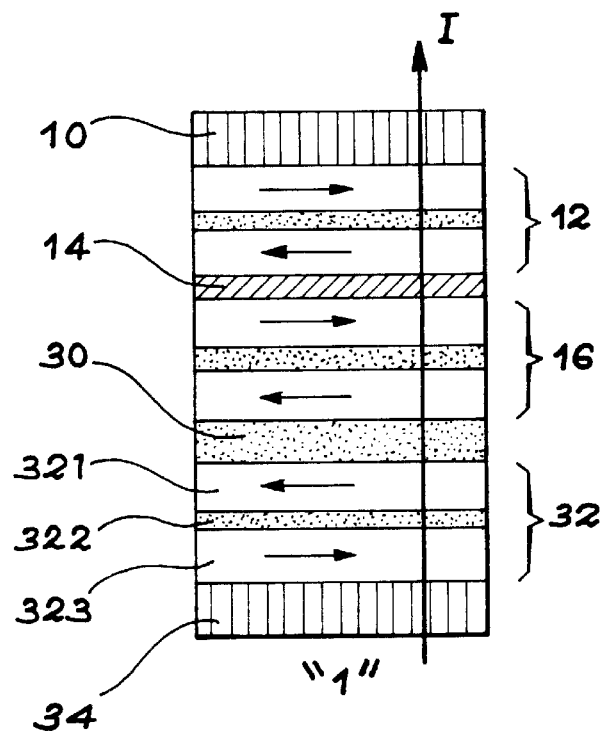

Writing of magnetic states "1" and "0" is performed as before, by the choice of orientation of the direction of the current, as shown in FIGS. 6A and 6B. The addition of the third tri-layer (32) stabilizes the magnetic states and thus enables the critical current density to be reduced by a factor of 2. In the case of writing a "0" (FIG. 6A), the polarised current in layer 123 according to (−y) (in relation to a common tri-rectangular trihedron Oxyz not represented) causes alignment of layer (161) by transfer of the moments from the electrons to layer (161), the electrons remaining polarised according to (−y) and becoming polarised according to (+y) after passing into layer (163), without causing reversal of layer (163) due to the anti-ferromagnetic exchange between layers (161) and (163) which is far higher than the coupling exercised by the electrons. On reaching the level of layer (321), the majority electrons will accumulate in layers (30) and (163), thus stabilizing the orientation of layer (163). It can therefore be considered that the polariser (12) acts by transmission of polarised electrons whereas the polariser (32) acts by reflection of polarised electrons.

In order to write a "1", the roles of the polarisers are reversed, but the stabilisation and critical density lowering effects remain.

The polariser (32) eliminates the magneto-static coupling field on layer (16) and also provides an identical exchange direction between layers (121) and (323) in order to enable the magnetic sorting of the anti-ferromagnetic exchange layers (10) and (34). It is in fact difficult to define two opposite exchange directions in a system which uses a single anti-ferromagnetic material.

Reading is achieved as in the first variant, by injecting a current at a density lower than the critical density and by comparing the measured voltage with the voltage at a reference junction.

The two designs described above may be compared in the table below, where:

t is the thickness of the magnetic layer to be reversed,

Ms is the magnetisation at saturation of the layer to be reversed, in the case of CoFe (Ms=1500 emu/cc), Hk is the anisotropy of the magnetic layer to be reversed, Jc (write) is the current density for writing a memory cell, $RA_{max}$ is the product of the resistance by the surface area of the tunnel junction, defined such that the write voltage does not exceed 0.6 V, Jc (read) is the current density for a reading voltage of 0.3 V with $RA_{max}$, $a_{min}$ is the minimum size of one side of the memory cell (for a square memory cell) before reaching the superparamagnetic limit.

The value of $a_{min}$ is calculated using the following formula:

$$a_{\min} = \sqrt{\frac{84 k_B T}{M_s H_k t}}$$

in which the value 84 is calculated by considering a 100-year service life for the memory at a temperature of 100° C.

| Design | 1 | 2 |
|---|---|---|
| t (nm) | 5 | 5 |
| Ms (emu/cc) | 1500 | 1500 |
| Effective Hk (G) | 40 | 40 |
| Jc (write) (A/cm$^2$) | 3.2E +05 | 1.6E +05 |
| $RA_{max}$ (ohm.$\mu m^2$) | 188 | 375 |
| Jc (read) (A/cm$^2$) | 1.6E +05 | 8E +04 |
| $a_{min}$ (micron) | 0.12 | 0.12 |

It can be seen from this table, that with the invention, it is possible to achieve low write current densities, compatible with reasonable RA product junctions (>100 $\Omega.\mu m^2$). Such RA products may be obtained, either by plasma oxidation, or by natural oxidation in-situ.

Figure 7:
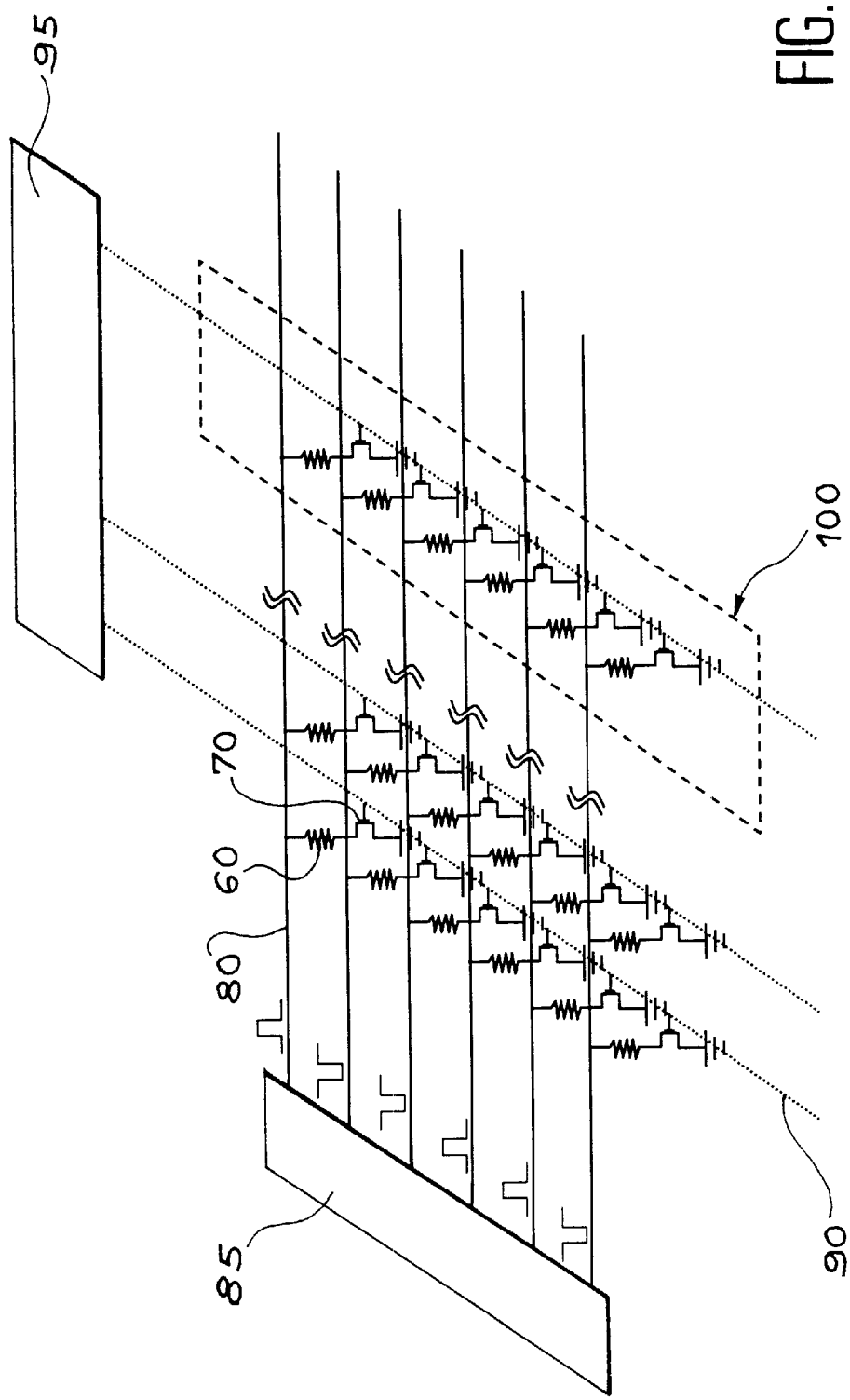
FIG. 7 is a schematic representation of a memory using a matrix of devices in accordance with the invention.

Finally, FIG. 7 shows a memory formed of a matrix of memory cells addressable by rows and columns. Each memory cell includes a device in accordance with the invention, with a stack of layers symbolised by a resistor (60) and a switching device (70) consisting of a transistor. Each stack is connected to an addressing row (80) and the base (or gate) of the transistor has an addressing column (90). The rows (80) are called "bit lines" and the columns are called "word (or digit) lines". The rows (80) are connected to the outputs of a row addressing circuit (85) and the columns (90) to the outputs of a column addressing circuit (95).

When a sequence of bits is to be written (e.g. 100110), the column addressing is called up by an impulse suitable for opening the transistors in the column concerned and a current pulse of appropriate polarity is sent to each line (in the example taken, respectively +−−++−). All the bits are thus written in the column of the memory simultaneously.

This multiple addressing process is made possible by the invention since, as explained in the introduction, a memory cell may be written in without any danger of unintentional writing in the adjacent cells.

Somewhere in the memory, for example in the center, there is a reference column (100), which enables reading. When a reading current flows in the memory cells of a column (90), the read voltage of each memory cell is compared with the voltage read from the memory cell in the reference column belonging to the same row.

This writing and reading mechanism in columns considerably reduces the cycle time of the memory.

What is claimed is:

1. A magnetic recording device comprising:
   at least one magnetic cell including,
   a first magnetic layer having a fixed magnetization direction and configured to spin polarize a writing current of electrons,
   a second magnetic layer having a first tri-layer stack that includes two magnetic layers with anti-parallel magnetizations, separated by a first conducting non-magnetic layer, said second magnetic layer having a variable magnetization direction oriented as a function of a direction of a spin polarized writing current of electrons having a predetermined writing density,
   an insulating or semi-conducting layer that separates the first layer from the second layer, and
   said first magnetic layer configured to align said variable magnetization direction with said fixed magnetization direction by directing an incident writing current of electrons perpendicular through said first magnetic layer and then perpendicular through said second magnetic layer, and to oppose said variable magnetization direction with said fixed magnetization direction by directing another incident writing current of electrons perpendicular through said second magnetic layer and then perpendicular through said first magnetic layer.

2. The device of claim 1, wherein said first magnetic layer comprises a second tri-layer stack that includes two magnetic layers with anti-parallel magnetizations, separated by a second conducting non-magnetic layer, said second tri-layer stack being covered with a first layer of anti-ferromagnetic exchange which fixes said fixed magnetization direction in said second tri-layer stack.

3. The device of claim 2, further comprising:
   a third tri-layer stack that includes two magnetic layers with anti-parallel magnetizations, separated by a third conducting non-magnetic layer, said third tri-layer stack is separated from the second magnetic layer by a fourth conducting non-magnetic layer, and said third tri-layer stack is mounted on a second anti-ferromagnetic exchange layer which fixes a magnetization direction in said third tri-layer stack.

4. The device of claim 1, wherein the two magnetic layers in the first tri-layer stack are of the same thickness.

5. The device of claim 1, wherein the magnetic layers of at least one of the first tri-layer stack, the second tri-layer stack, and the third tri-layer stack are made from a material taken from the group formed by Co, Fe, Ni and their alloys.

6. The device of claim 1, wherein at least one of the second conducting non-magnetic layer of the first tri-layer stack, the first conducting non-magnetic layer of the second tri-layer stack, and the third conducting non-magnetic layer of the third tri-layer stack is made from a metal taken from the group formed by Ru, Re, Cu, Cr, Pt, and Ag.

7. The device of claim 2, wherein at least one of the first anti-ferromagnetic layer and the second anti-ferromagnetic layer is made from a Mn-based alloy.

8. The device of claim 1, further comprising:
   a writing unit configured to carry said writing current of electrons based on information data.

9. The device of claim 8, further comprising:
a reading unit configured to carry and pass a reading current of electrons through said first and second magnetic layers with a reading density less than said predetermined writing density, and
a measuring unit configured to measure a voltage at terminals of the magnetic recording device.

10. The device of claim 1, further comprising:
a matrix of memory cells addressable via addressable rows and columns; and
current switches connected in series with said memory cells, each memory cell being connected to an addressing row of said rows and each current switch being connected to an addressing column of said columns.

11. The device of claim 10, further comprising:
a reference column; and
a comparing unit configured to compare a voltage read at terminals of a first memory cell located at an intersection between a predetermined row of said rows and a predetermined column of said columns, and a voltage read at terminals of a second memory cell located at an intersection between said predetermined row and said reference column.

* * * * *